(12) United States Patent
Mett et al.

(10) Patent No.: US 11,385,307 B2
(45) Date of Patent: Jul. 12, 2022

(54) STRONGLY COUPLED FOURTH-ORDER RESONANCE COIL SYSTEMS FOR ENHANCED SIGNAL DETECTION

(71) Applicant: THE MEDICAL COLLEGE OF WISCONSIN, INC., Milwaukee, WI (US)

(72) Inventors: Richard R. Mett, Cedarburg, WI (US); James S. Hyde, Dousman, WI (US); Jason W. Sidabras, Milwaukee, WI (US)

(73) Assignee: The Medical College of Wisconsin, Inc., Milwaukee, WI (US)

( * ) Notice: Subject to any disclaimer, the term of this patent is extended or adjusted under 35 U.S.C. 154(b) by 464 days.

(21) Appl. No.: 16/334,505

(22) PCT Filed: Sep. 18, 2017

(86) PCT No.: PCT/US2017/052045
§ 371 (c)(1),
(2) Date: Mar. 19, 2019

(87) PCT Pub. No.: WO2018/053419
PCT Pub. Date: Mar. 22, 2018

(65) Prior Publication Data
US 2021/0286032 A1    Sep. 16, 2021

Related U.S. Application Data

(60) Provisional application No. 62/396,579, filed on Sep. 19, 2016.

(51) Int. Cl.
*G01R 33/36* (2006.01)
*G01R 33/3415* (2006.01)

(52) U.S. Cl.
CPC ..... *G01R 33/3642* (2013.01); *G01R 33/3415* (2013.01); *G01R 33/3635* (2013.01)

(58) Field of Classification Search
CPC ............ G01R 33/3415; G01R 33/3635; G01R 33/3642
See application file for complete search history.

(56) References Cited

U.S. PATENT DOCUMENTS 4,363,730 A   12/1982   Gustafsson
4,725,779 A    2/1988   Hyde et al.
(Continued)

OTHER PUBLICATIONS

The International Search Report and Written Opinion for International Patent Application No. PCT/US2017/052045 with a dated Nov. 28, 2017.
(Continued)

*Primary Examiner* — Dixomara Vargas
(74) *Attorney, Agent, or Firm* — Quarles & Brady LLP

(57) ABSTRACT

A resonant coil system with improved sensitivity and signal-to-noise performance is described. A primary coil is tuned to a first resonance frequency and inductively coupled to a secondary coil that is separately tuned to a second resonance frequency. The primary and secondary coils form a resonant system with a resonance frequency that is a function of the primary and secondary coil resonance frequencies. The resonance frequency of the coil system is less than both the primary resonance frequency and the secondary resonance frequency. The mutual inductance between the two coils is high and the resonance frequency of the coil system's parallel mode is well separated from that of the anti-parallel mode.

20 Claims, 3 Drawing Sheets

(56) References Cited

U.S. PATENT DOCUMENTS

| | | | | |
|---|---|---|---|---|
| 5,081,418 | A * | 1/1992 | Hayes | G01R 33/34046 324/318 |
| 5,365,173 | A * | 11/1994 | Zou | G01R 33/34 324/318 |
| 5,999,000 | A | 12/1999 | Srinivasan | |
| 6,023,166 | A | 2/2000 | Eydelman | |
| 6,400,154 | B2 | 6/2002 | Tomanek et al. | |
| 6,624,633 | B1 | 9/2003 | Zou et al. | |
| 6,727,707 | B2 * | 4/2004 | Sinclair | G01V 3/32 324/339 |
| 6,765,381 | B2 | 7/2004 | Barbara | |
| 6,847,210 | B1 | 1/2005 | Eydelman et al. | |
| 6,850,064 | B1 * | 2/2005 | Srinivasan | G01R 33/34046 324/318 |
| 8,089,281 | B2 | 3/2012 | Zhai et al. | |
| 8,148,986 | B2 * | 4/2012 | Driesel | G01R 33/34046 324/318 |
| 8,779,768 | B2 | 7/2014 | Brey et al. | |
| 8,901,775 | B2 * | 12/2014 | Armstrong | H02J 7/0068 307/104 |
| 9,406,435 | B2 * | 8/2016 | Georgakopoulos | H01F 27/006 |
| 9,466,418 | B2 * | 10/2016 | Georgakopoulos | H01F 38/14 |
| 9,799,443 | B2 * | 10/2017 | Georgakopoulos | H01F 27/006 |
| 9,839,732 | B2 * | 12/2017 | Armstrong | H02J 5/005 |
| 2004/0056663 | A1 * | 3/2004 | Sinclair | G01V 3/32 324/367 |
| 2006/0173284 | A1 * | 8/2006 | Ackerman | G01R 33/34046 600/422 |
| 2007/0247160 | A1 * | 10/2007 | Vaughan | G01R 33/3453 324/322 |
| 2008/0278167 | A1 * | 11/2008 | Vaughan, Jr. | G01R 33/345 324/318 |
| 2009/0096553 | A1 * | 4/2009 | Driesel | G01R 33/345 333/219 |
| 2010/0253333 | A1 | 10/2010 | Zhai et al. | |
| 2012/0112748 | A1 * | 5/2012 | Hetherington | G01R 33/3635 324/318 |
| 2013/0119987 | A1 | 5/2013 | Felmlee | |
| 2013/0271144 | A1 * | 10/2013 | Avdievich | G01R 33/365 324/322 |
| 2014/0084703 | A1 * | 3/2014 | Hall | B60L 53/64 307/104 |
| 2014/0320131 | A1 * | 10/2014 | Brey | G01R 33/62 324/322 |
| 2014/0361627 | A1 * | 12/2014 | Kurs | H02J 7/025 307/104 |
| 2015/0293194 | A1 * | 10/2015 | Kalechofsky | G01R 33/3621 600/410 |
| 2016/0197489 | A1 * | 7/2016 | Kurs | H02J 7/00304 320/108 |
| 2016/0231400 | A1 * | 8/2016 | Fath | G01R 33/3875 |
| 2017/0338696 | A1 * | 11/2017 | Bae | H02J 50/00 |
| 2018/0168480 | A1 * | 6/2018 | Kalechofsky | A61B 5/055 |

OTHER PUBLICATIONS

Bilgen, M, "Inductively-overcoupled coil design for high resolution magnetic resonance imaging." BioMedical Engineering Online 2006, 5:3 (2006), Fig 1,2, 6, p. 1-3, 5, [online] (retrieved on Oct. 28, 2017] <URL: https://biomedical-engineering-online.biomedcentral.com/track/pdf/10.1186/14 75-925X-5-3>.

Tomanek, Boguslaw, "Innovative Mutually Inductively Coupled Radiofrequency Coils for Magnetic Resonance Imaging and Spectroscopy," Habilitation Thesis, The Henryk Niewodniczanski Institute of Nuclear Physics, Polish Academy of Sciences, Oct. 2006, pp. 1-59, Report No. 1980/B, Institute of Biodiagnostics, Winnipeg and Calgary, Canada.

Hoult, D.I., "Use of Mutually Inductive Coupling in Probe Design," Institute for Biodiagnostics, National Research Council Canada, 2002, pp. 262-285, vol. 15(4), Wiley Periodicals, Inc., Canada.

Volland, Nelly A., "Development of an inductively-coupled MR coil system for imaging and spectroscopic analysis of an implantable bioartificial contrust at 11.1T," Magn Reson Med., Apr. 2010; 63(4): 998-1006. doi: 10.1002/mrm.22268, pp. 1-18.

Hoult, David I., "A High-Sensitivity, High-B1 Homogeneity Probe for Quantitaion of Metabolites," Magentic Resonance in Medicine 16, 1990, pp. 411-417, Academic Press, Inc.

* cited by examiner

STRONGLY COUPLED FOURTH-ORDER RESONANCE COIL SYSTEMS FOR ENHANCED SIGNAL DETECTION

CROSS-REFERENCE TO RELATED APPLICATIONS

This application represents the national stage entry of PCT International Application No. PCT/US2017/052045 filed on Sep. 18, 2017, which claims the benefit of U.S. Provisional Patent Application Ser. No. 62/396,579, filed on Sep. 19, 2016 and entitled "STRONGLY COUPLED FOURTH-ORDER RESONANCE COIL SYSTEMS FOR ENHANCED SIGNAL DETECTION," which is herein incorporated by reference in its entirety.

STATEMENT REGARDING FEDERALLY SPONSORED RESEARCH

This invention was made with government support under EB001980 and EB000215 awarded by the National Institutes of Health. The government has certain rights in the invention.

BACKGROUND

Magnetic resonance imaging ("MRI") employs a magnetic field and radio frequency ("RF") energy to create images. MRI implements RF coils that transmit RF pulses to a sample, object, or subject, and receive magnetic resonance signals in response thereto. Two types of coil designs are commonly used in clinical MRI scanners: volume coils and surface coils. Volume coils provide a homogeneous RF excitation across a large volume, which allows whole-body imaging as well as imaging of the head and extremities. Surface coils can include single or multi-turn loops of conductive material, usually copper, that are placed directly over the area to be imaged. They allow for higher RF sensitivity than volume coils, but over a smaller region of the anatomy than that imaged by volume coils, resulting in a small field of view.

The current flowing through a surface coil is not uniformly distributed across a cross-sectional area of the coil wire. Instead, current flow tends to be concentrated near the surface of the coil wire. This tendency is known as the "skin effect." The depth of the region through which current actually flows is the "skin depth," which decreases as frequency increases. Because the cross sectional area of the conductor through which the current can flow is reduced, the skin effect results in increased resistance, which can reduce the performance of the coil.

A quantitative measurement of a coil's performance is its Q-value. Q-value is a function of inductance and resistance in the coil. As resistance increases, there is an undesirable decrease in Q-value. The Q-value of a surface coil or loop-gap-resonator is limited by the skin depth because the cross sectional area of the part of the conductor carrying current is proportional to the skin depth. Thus, skin depths can be extremely shallow at the RF frequencies required for high field strength MRI magnets. For example, the skin depth for a copper surface coil wire at 300 MHz (i.e., the Larmor frequency of hydrogen in a 7 T magnetic field) is a microscopic 3.8 micrometers, which is much smaller than the thickness of the typical conductors from which surface coils are constructed.

Higher field strength MRI magnets (e.g., 3 T and 7 T) were developed to increase image resolution and decrease scanning time. However, as magnetic field strengths have increased, it has been challenging to build suitable surface coils because of the degradation in coil performance (Q-value, signal-to-noise) that results from the increased RF frequencies needed at higher magnetic field strengths. As a result, while image resolution and scanning times for 3 T MRI scanners in current use for medical imaging are an improvement over the older 1.5 T scanners, they do not operate at their theoretical maximum level of effectiveness.

Another problem associated with surface coils is the result of innovations intended to expand the volume that is effectively imaged by surface coils. This is accomplished by creating arrays of multiple surface coils in various configurations that enhance the field of view, while retaining the benefit of higher RF sensitivity characteristic of surface coils. However, placing surface coils in proximity to each other can create an undesirable "proximity effect." When two or more adjacent conductors (e.g., arrayed surface coils) carry current, the current distribution in one conductor is affected by the magnetic field produced by adjacent conductors. For example, in parallel wires carrying currents in the same direction, the proximity of the currents to each other will cause the currents to concentrate on the most distant surfaces of the wire conductor, thus constraining current flow and thereby increasing resistance beyond what would be predicted based simply on the skin effect. As a result, the Q-value is degraded even further. In addition, like skin effects, proximity effects intensify as magnet field strengths increase.

In order to maximize the capabilities of existing 3 T MRI scanners, and to develop high Q-value surface coils that will be needed for the next generation of clinical MRI scanners that will employ ultra-high magnetic fields (e.g., 7 T), there is a need for the development of high Q-value coils with improved signal-to-noise ratio ("SNR") that are not susceptible to the surface and proximity effects that negatively affect current coil technologies.

SUMMARY OF THE DISCLOSURE

The present disclosure provides an inductively coupled coil system that includes a primary coil independently tuned to a first resonance frequency and a secondary coil independently tuned to a second resonance frequency. The primary coil is inductively coupled to the secondary coil such that the inductively coupled RF coil system has a third resonance frequency that is a function of the first resonance frequency and the second resonance frequency. The third resonance frequency is lower than the first resonance frequency and the second resonance frequency.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is made therefore to the claims and herein for interpreting the scope of the invention.

DETAILED DESCRIPTION

Described here is a resonant coil system with improved sensitivity and signal-to-noise performance, which may be used as a reception coil in nuclear magnetic resonance ("NMR"), magnetic resonance imaging ("MRI"), electron paramagnetic resonance ("EPR"), and other similar applications. The coil system of the present disclosure can also be used for more efficiently transmitting electromagnetic waves, such as for NMR, MRI, and EPR applications, in addition to non-imaging or non-spectroscopy applications. For instance, coil systems constructed as described here could be used as radio frequency ("RF") transmit coil for MRI that can provide excitation of nuclear spins with reduced specific absorption rate ("SAR"). In some examples, the coil system of the present disclosure can be used as both a transmit and receive coil.

The coil system can also be adapted for non-imaging technologies, such as for use in antennas and low-noise amplifiers. For example, improved radio antennas (e.g., patch antennas) could be constructed using the fourth-order coupled coil systems described here, thereby allowing for a significant reduction in the size of the antennas without loss of sensitivity. Antennas constructed using the coil systems described here could also have an added degree of adjustability by varying voltage, power, or both. It is also contemplated that antennas constructed using the coil systems described here would have improved directivity.

In general, the coil system of the present disclosure includes a primary coil connected to a capacitive network for tuning the primary coil to a first resonance frequency. The primary coil is inductively coupled to a secondary coil that is separately tunable to a second resonance frequency. The primary and secondary coils form a resonant system with a resonance frequency that is a function of the primary and secondary coil resonance frequencies, and whereby the resonance frequency of the coil system is less than both the primary resonance frequency and the secondary resonance frequency. The mutual inductance between the two coils is high and the resonance frequency of the coil system's parallel mode is well separated from that of the anti-parallel mode.

The coil system described here advantageously has a higher sensitivity and improved depth sensitivity compared to conventional surface coils. For instance, relative to conventional surface coils, the coil system of the present disclosure can provide a higher Q-value, improved vector reception field ("VRF"), and decrease in noise.

Figure 1:
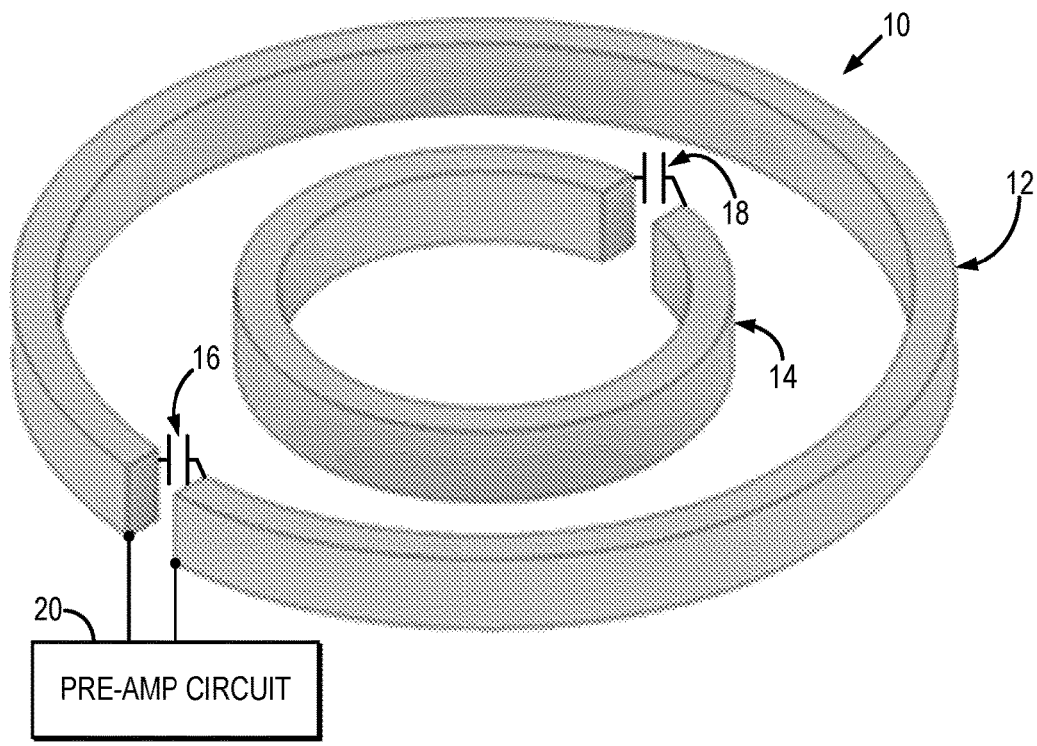
FIG. 1 is an illustration of an example coil system that includes a primary coil and a secondary coil that are inductively coupled and generally constructed to provide a fourth-order coil system.
Figure 2:
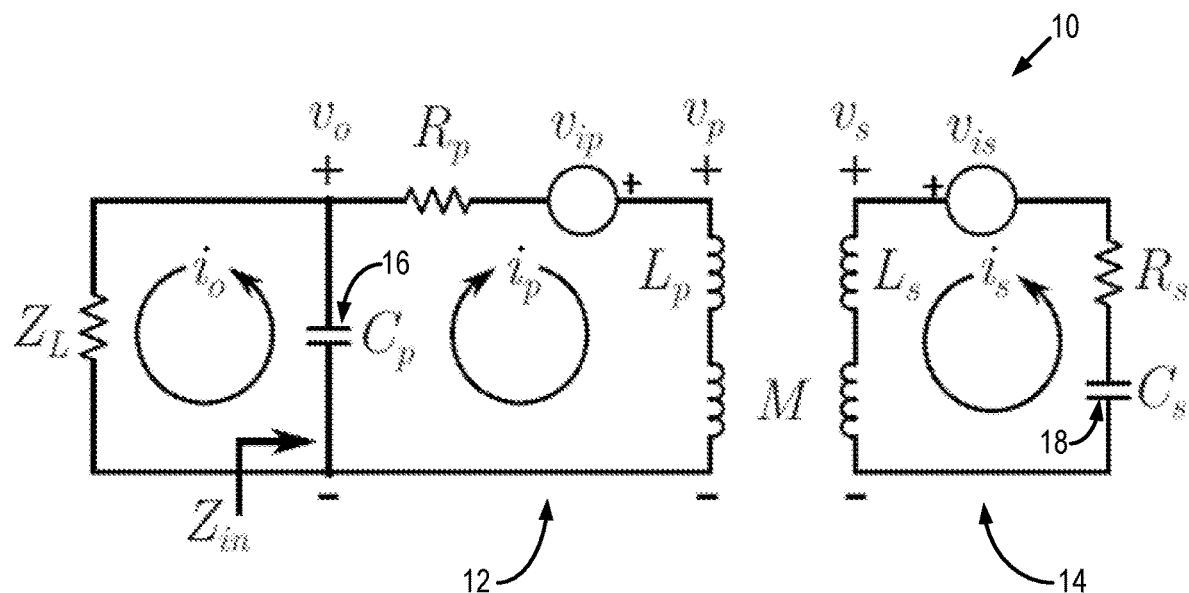
FIG. 2 is an example of a circuit diagram of a coil system of the present disclosure.

FIG. 1 illustrates a block diagram of an example of a coil system 10 designed in accordance with some aspects of this disclosure, and FIG. 2 illustrates one example of a circuit diagram for such a coil system 10. The coil system 10 generally includes a primary coil 12 and a secondary coil 14. The primary coil 12 and the secondary coil 14 are inductively coupled.

The primary coil 12 is tunable to a first resonance frequency, $\omega_p$, and the secondary coil 14 is tunable to a second resonance frequency, $\omega_s$, which may be the same as or different from the first resonance frequency, $\omega_p$. As an example, the primary coil 12 can be tuned to the first resonance frequency, $\Omega_p$, via a capacitor 16, and the secondary coil 14 can be tuned to the second resonance frequency, $\omega_s$, via a capacitor 18. In other designs, one or more capacitors may be used to tune either the primary coil 12 or the secondary coil 14. The design of the coil system 10 is such that tuning the primary coil 12 to the first resonance frequency, $\omega_p$, and the secondary coil 14 to the second resonance frequency, $\omega_s$, results in a resonance frequency, $\omega'$, for the coil system 10 that is a function of the first and second resonance frequencies, but different from and less than both the first and second resonance frequencies.

Figure 3:
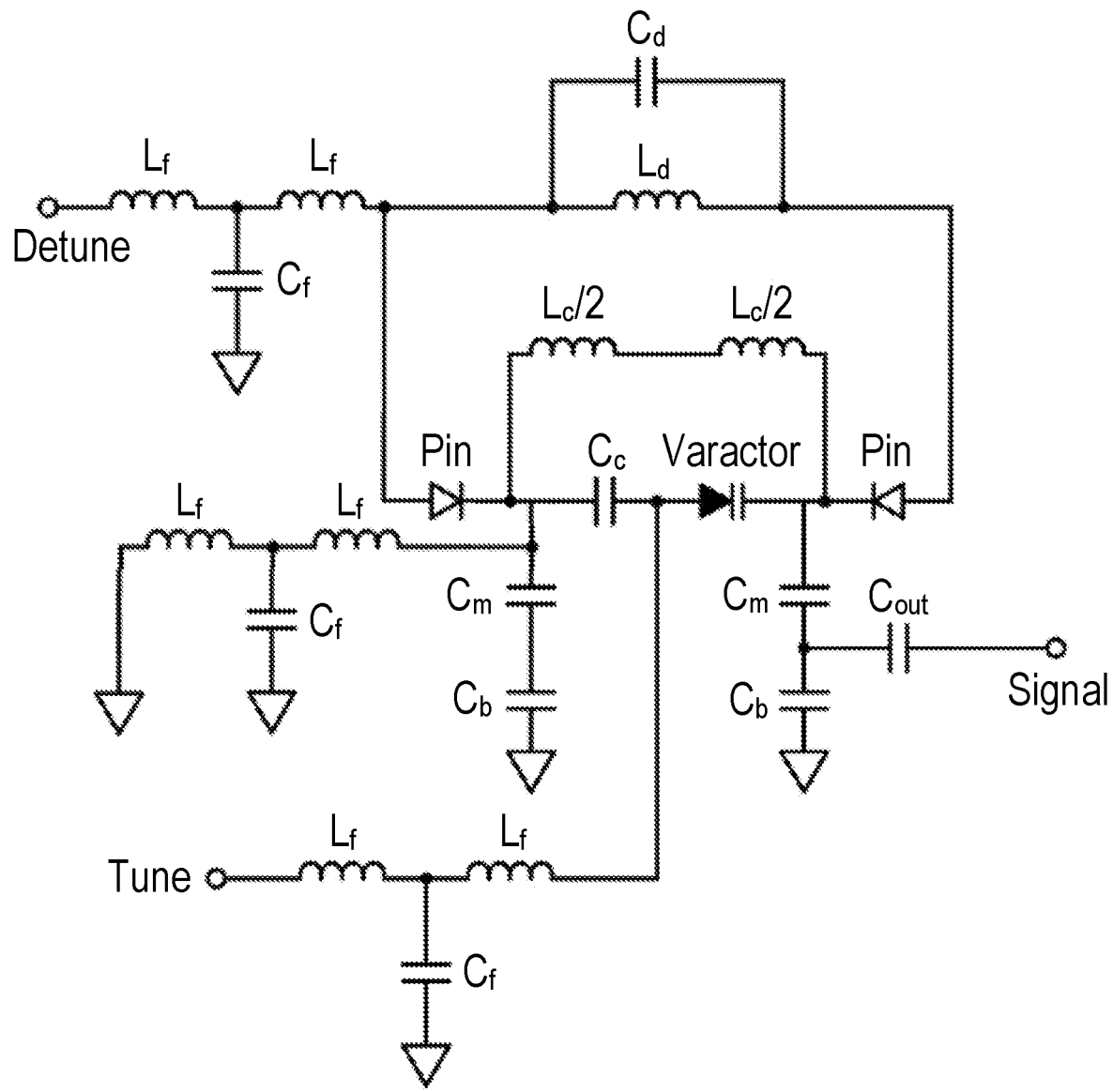
FIG. 3 is an example of a coupling circuit that can be used for capacitive tuning of a primary coil.

In some embodiments, the primary coil 12 can be tuned with a coupling circuit. An example coupling circuit is illustrated in FIG. 3. The coupling circuit shown in FIG. 3 is a balanced, remotely-tuned coupling circuit. This example coupling circuit employs varactor-based tuning to change the resonant frequency of the primary coil 12 to compensate for sample loading. The capacitor, $C_c$, is used for initial tuning of the resonant frequency and to provide a bias to the varactor. The circuit is balanced by design, indicated by zero potential between the coil inductance, $L_c$, and matched by choosing the proper capacitances for $C_m$ and $C_b$. The signal is acquired by the circuit through a doubled-shielded coaxial cable after a 100 pF capacitor, $C_{out}$. A resonant circuit is put in parallel when the detune circuit activates (detune 3.3 V, receive mode −30 V) two pin-diodes, (Pin). The detune, tune, and DC ground are all filtered by a low-pass filter with greater than −45 dB transmission at 400 MHz, determined by the $L_f$ and $C_f$ pi-networks. All capacitors in the coupling circuit are selected to provide high self-resonant frequencies and low equivalent series resistance. The inductors in the coupling circuit are ceramic-core high-Q inductors.

Referring again to FIG. 1, signals received by the secondary coil 14 induce a current in the primary coil 12, which is in electrical communication with a pre-amplifier circuit 20 for measuring and recording the detected signal. In general, the construction of the coil system 10 is such that the current flowing in the primary coil 12 and the secondary coil 14 are substantially in phase. In other embodiments, the phase difference between the current flowing in the primary coil 12 and the current flowing in the secondary coil 14 is less than ninety degrees.

In general, the primary coil 12 and the secondary coil 14 are arranged proximate each other, such that signals detected in the secondary coil 14 can induce a current in the primary coil 12. In some configurations, the coils can be arranged to be adjacent or otherwise proximate each other. In some configurations, the coils can be arranged to be partially or fully overlapping.

In some configurations, the primary coil 12 and secondary coil 14 are generally positioned such that the outer extent of the secondary coil 14 is arranged within the inner extent of the primary coil 12. For example, in some embodiments, the primary coil 12 and the secondary coil 14 can have a generally circular cross section and can be sized such that the outer diameter of the secondary coil 14 is smaller than the inner diameter of the primary coil 12, and the coils can be positioned such that the secondary coil 14 is arranged within the inner diameter of the primary coil 12. In some embodiments, the primary coil 12 and the secondary coil 14 are coaxial with each other.

The primary coil 12 and the secondary coil 14 can also be arranged to be generally coplanar. In configurations where the coils have different thicknesses, the primary coil 12 and the secondary coil 14 can be arranged to be generally coplanar by aligning the bottom surfaces of the coils, the top surfaces of the coils, or some other coplanar arrangement (e.g., aligning the midpoint of the axial length of the primary coil 12 and the midpoint of the axial length of the secondary coil 14).

Figure 4:
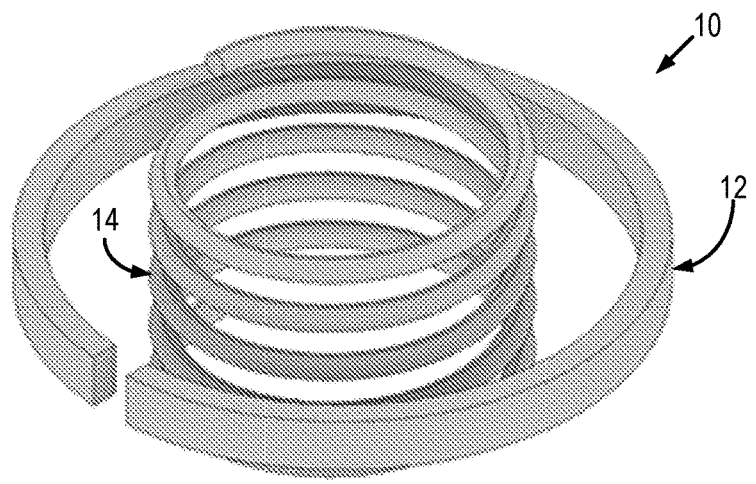
FIG. 4 is an example of a coil system having a single loop primary coil and a coaxial helical secondary coil.
Figure 5:
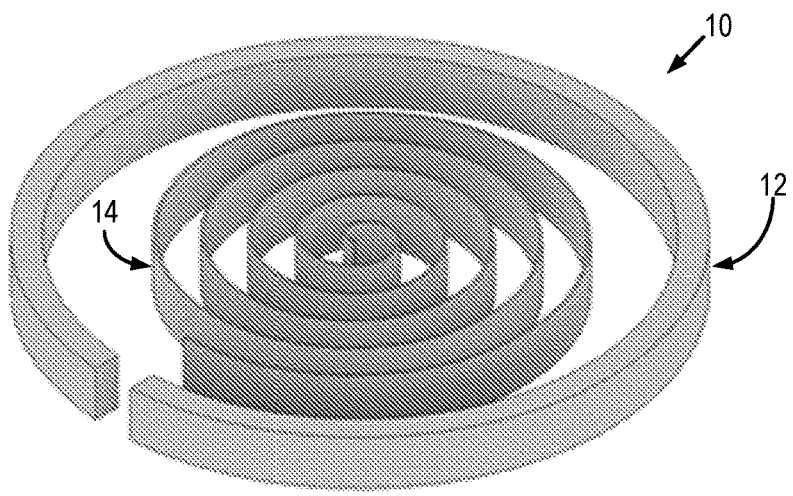
FIG. 5 is an example of a coupled coil system according to the present disclosure having a single loop primary coil and a coaxial self-resonant spiral secondary coil.
Figure 6:
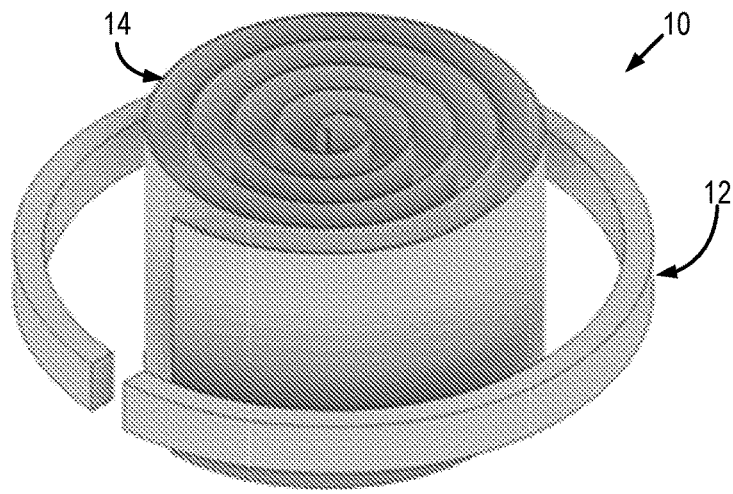
FIG. 6 is an example of a coupled coil system according to the present disclosure having a single loop primary coil and a coaxial self-resonant spiral secondary coil with an axial length greater than the axial thickness of the primary coil.

Example configurations of primary and secondary coils are illustrated in FIGS. 4-6. In FIG. 4, the primary coil 12 is a single loop coil and the secondary coil 14 is a helical coil with an outer diameter that is smaller than the inner diameter of the primary coil 12. In this example, the secondary coil 14 is arranged such that its midpoint of its axial length is aligned with the midpoint of the axial length of the primary coil 12. In FIG. 5, the primary coil 12 is a single loop coil and the secondary coil 14 is a self-resonant spiral coil with an outer diameter that is smaller than the inner diameter of the primary coil 12. In this example, the secondary coil 14 is arranged such that it is coplanar with the primary coil 12. In FIG. 6, the primary coil 12 is a single loop coil and the secondary coil 14 is a self-resonant spiral coil with an axial length greater than the axial thickness of the primary coil 12. The secondary coil 14 has an outer diameter that is smaller than the inner diameter of the primary coil 12. In this example, the secondary coil 14 is arranged such that its midpoint of its axial length is aligned with the midpoint of the axial length of the primary coil 12. It will be appreciated by those skilled in the art that other configurations of the size, shape, and arrangement of the primary coil 12 and secondary coil 14 can be implemented while still adhering to the design consideration of the fourth-order coupled coil systems described here.

The response of an inductively coupled system of coils can be described by considering an electromotive force ("EMF") induced by the spins in each coil, the theory of inductively coupled resonant circuits, and the superposition principle to derive the total voltage present across the capacitor of the primary coil 12.

The EMF, $\xi$, induced in a coil by the magnetic dipole moments of spins is given by, $$\xi = -\int_{sample} \frac{\partial}{\partial t} B_1 \cdot M_0 dV_s; \quad (1)$$

where $B_1$ represents the magnetic field at the sample volume, $dV_s$, produced by the coil per unit current in the coil. The magnetization of the spins is $M_0$. When there are two coils, an EMF is induced in both coils.

As shown in FIG. 2, the coil system 10 described here can include a first (e.g., primary) coil 12 and a secondary coil 14. One effect of the secondary on the primary is that the impedance of the secondary appears as an additional series impedance in the primary according to the relation, $$Z_p = R_p + jX_p + \frac{(\omega M)^2}{R_s + jX_s}; \quad (2)$$

where $R_p + jX_p$ is the impedance of the primary when considered by itself, $Z_s + jX_s$ is the impedance of the secondary when considered by itself, and M is the mutual inductance between the two coils. Using Eqn. (2), the impedance $Z_{in}$ at the primary capacitor 16 can be written as, $$Z_{in} = \frac{(j\omega L_p + R_p)\left(1 - \frac{\omega^2}{\omega_s^2} + j\frac{\omega}{\omega_s Q_s}\right) + j\omega L_p \frac{\omega^2}{\omega_s^2} k^2}{K}; \quad (3)$$

where the fourth-order denominator, K, is given by, $$K = \left(1 - \frac{\omega^2}{\omega_p^2} + j\frac{\omega}{\omega_p Q_p}\right)\left(1 - \frac{\omega^2}{\omega_s^2} + j\frac{\omega}{\omega_s Q_s}\right) - \frac{\omega^4}{\omega_p^2 \omega_s^2} k^2. \quad (4)$$

In Eqns. (3) and (4), $$\omega_p = \frac{1}{\sqrt{L_p C_p}}; \quad (5)$$

$$Q_p = \frac{\omega_p L_p}{R_p}; \quad (6)$$

$$\omega_s = \frac{1}{\sqrt{L_s C_s}}; \quad (7)$$

$$Q_s = \frac{\omega_s L_s}{R_s}; \quad (8)$$

and the computing coefficient, k, is given by, $$k = \frac{M}{\sqrt{L_p L_s}}. \quad (9)$$

The complex eigenfrequencies can be found from solutions for K=0. These eigenfrequencies can be expressed algebraically in closed form in terms of $\omega_p$, $\omega_s$, $Q_p$, $Q_s$, and k.

The resonance frequencies of the coil system 10 can be found by solving Re(K)=0, which yields the following:

$$\omega_{0\pm} = \sqrt{2}\left(\frac{1}{\omega_{ps}^2} \mp \sqrt{\frac{1}{\omega_{ps}^4} - \frac{4(1-k^2)}{\omega_p^2 \omega_s^2}}\right)^{-1/2}; \quad (10)$$

where, $$\frac{1}{\omega_{ps}^2} \equiv \frac{1}{\omega_p^2} + \frac{1}{\omega_s^2} + \frac{1}{\omega_p \omega_s Q_p Q_s}. \quad (11)$$

There are two modes: a parallel low-frequency mode and a high-frequency anti-parallel mode. In the parallel mode, the currents in the primary and secondary coils are generally flowing in the same direction (i.e., there is less than 90 degrees phase difference between them). In the anti-parallel mode, the currents in the primary and secondary coils are generally flowing in opposite directions. The real parts of the complex eigenfrequencies are different from these by an order of $Q^{-2}$, as for a second-order system.

When the coil system 10 is excited at resonance with a real-valued frequency, $\omega=\omega_0$, which can be either of the resonance frequencies defined by Eqn. (10), then Eqn. (4) can be written as, $$K_0 = \frac{j}{Q_L}; \qquad (12)$$

where, $$Q_L \equiv \left(\left(1 - \frac{\omega_0^2}{\omega_p^2}\right)\frac{\omega_0}{\omega_s Q_s} + \left(1 - \frac{\omega_0^2}{\omega_s^2}\right)\frac{\omega_0}{\omega_p Q_p}\right)^{-1}. \qquad (13)$$

Consequently, the input impedance at resonance can be written as, $$Z_{in0} = \omega_0 L_p Q_L\left(\left(1 - j\frac{\omega_p}{\omega_0 Q_p}\right)\left(1 - \frac{\omega_0^2}{\omega_s^2} + j\frac{\omega_0}{\omega_s Q_s}\right) + \frac{\omega_0^2}{\omega_s^2}k^2\right). \qquad (14)$$

For any excitation frequency, $\omega$, the voltage gain, $v_o/v_{ip}$, for an EMF, $v_{ip}$, generated in the first (e.g., primary) coil 12 can be obtained from, $$\frac{v_o}{v_{ip}} = -\left(\frac{j\omega L_p + R_p}{Z_L} + \frac{K + j\frac{\omega L_p}{Z_L}\frac{\omega^2}{\omega_s^2}k^2}{1 - \frac{\omega^2}{\omega_s^2} + j\frac{\omega}{\omega_s Q_s}}\right)^{-1}. \qquad (15)$$

For an EMF, $v_{is}$, generated in the second (e.g. secondary) coil 14, the voltage gain is, $$\frac{v_o}{v_{is}} = \frac{-k\sqrt{\frac{L_p}{L_s}\frac{\omega^2}{\omega_s^2}}}{K + \frac{j\omega L_p + R_p}{Z_L}\left(1 - \frac{\omega^2}{\omega_s^2} + j\frac{\omega}{\omega_s Q_s}\right) + \frac{j\omega L_p}{Z_L}\frac{\omega^2}{\omega_s^2}k^2}. \qquad (16)$$

Also, the secondary to primary current ratio of the coil system 10 is, $$\frac{i_s}{i_p} = \frac{k\sqrt{\frac{L_p}{L_s}\frac{\omega^2}{\omega_s^2}}}{1 - \frac{\omega^2}{\omega_s^2} + j\frac{\omega}{\omega_s Q_s}}. \qquad (17)$$

The secondary to primary current ratio, $i_s/i_p$, can be large near self-resonance of the secondary coil 14 and increases the vector reception field proportionately. In addition to this current ratio between the primary coil 12 and the secondary coil 14, the coil system 10 described here can provide a signal enhancement based on the Q-ratio between the coils as well as the structure of the coils themselves (e.g., if a self-resonant spiral coil is used for the secondary coil 14 then the number of turns in that coil can yield additional signal enhancement). From Eqns. (15)-(17), it can be seen that the following relationship holds:

$$\frac{v_o}{v_{is}} = \frac{v_o}{v_{ip}}\frac{i_s}{i_p}; \qquad (18)$$

which means that an EMF induced in the secondary coil 14 will give an output voltage at the primary coil 12 that is equal to the EMF in the primary coil 12 multiplied by the current ratio, $i_s/i_p$.

In the no-load limit of $Z_L \to +\infty$, the voltage gain for an EMF induced in the primary coil 12 becomes, at resonance, using Eqns. (10) and (12), $$\left.\frac{v_o}{v_{ip}}\right|_0 = jQ_{Pv}; \qquad (19)$$

where, $$Q_{Pv} \equiv Q_L\left(1 - \frac{\omega_0^2}{\omega_s^2} + j\frac{\omega}{\omega_s Q_s}\right). \qquad (20)$$

When load impedance, $Z_L$, is matched to $Z_{in0}$ from Eqn. (14), it can be seen form Eqn. (15) that, $$\left.\frac{v_o}{v_{ip}}\right|_{m0} = j\frac{Q_{Pv}}{2}. \qquad (21)$$

The signal at the output of the primary coil 12 for an EMF induced in both the primary coil 12 and the secondary coil 14 can be derived as follows. The physics of Eqn. (1) is that the EMF induced by spins in the coil system 10 can be understood relative to a magnetic field produced by the coil system 10 for a unit current in the coil system 10.

In the following example, the signal enhancement of a coupled coil system constructed in accordance with the present disclosure is described relative to a surface coil having a 15 mm diameter. In this example, the coupled coil system includes a 3-turn self-resonant spiral ("SRS") coil with an inner diameter of 10.4 mm and outer diameter of 15.1 mm positioned co-axially within a single loop coil with a 25 mm diameter. The magnetic field on the axis of a circular loop of radius, R, is, $$B = \frac{\mu_0 i R^2}{2(R^2 + z^2)^{3/2}}; \qquad (22)$$

where $\mu_0$ is the magnetic permeability of free space and z is the axial distance from the plane of the coil. Considering a voxel located 5 mm below a sample surface, for a 15 mm coil placed on the sample surface the EMF will be scaled with R=7.5 mm and z=5 mm, $$v_i \approx \frac{7.5^2}{(7.5^2 + 5^2)^{3/2}}. \qquad (23)$$

Because the 25 mm coil is centered on the midplane of the SRS coil, the EMF is scaled as, $$v_{ip} \approx \frac{12.5^2}{(12.5^2 + 10^2)^{3/2}}; \quad (24)$$

and for the SRS, an average coil radius of 6.5 mm is used to yield, $$v_{is} \approx 3\left(\frac{6.5^2}{(6.5^2 + 5^2)^{3/2}}\right). \quad (25)$$

In Eqn. (25), the factor of three comes from normalizing to unit current in the coil with three turns. These scaling can be applied to the output voltages given in Eqns. (18) and (21) and by, $$\left.\frac{v_o}{v_i}\right|_{m0} = j\frac{Q}{2}; \quad (26)$$

which is the voltage gain when the load impedance $Z_L$ is matched to $Z_{in0}$ in a second-order circuit. When these scalings are applied, the following signal enhancement factor for the output voltage at the primary compared to the secondary coil is provided, $$\varepsilon = \left(0.5 + 3\frac{i_s}{i_p}\right)\frac{Q_{Pv}}{Q}. \quad (27)$$

In Eqn. (27), the term in parenthesis is the ratio of the vector reception field of the inductively coupled coil system to the vector reception field of the 15 mm coil. It is seen from Eqn. (27) that there are three factors that contribute to the signal enhancement: the Q-ratio, the number of turns of the SRS, and the secondary to primary current ratio.

The second enhancement factor has been used for surface coil design; however, conventional spiral surface coils tend to have low Q-value. The secondary-to-primary current ratio can be large near self-resonance of the secondary and increases the vector reception field proportionately. However, as the current ratio increases, $Q_{Pv}$ tends to decrease, and the total signal enhancement tends to be a weak function of the five parameters. The enhancement factor dies for the low-frequency mode as the coupling coefficient, k, tends towards zero because the modes become separated, $\omega_{0+} \to \omega_p$, $\omega_{0-} \to \omega_s$.

By examining the signal enhancement factor with respect to variations in the coupling coefficient, k, and Q-values, it was found that for the low-frequency (i.e., parallel) mode, the signal enhancement attainable with the coil system 10 is at a maximum near the square root of the k-value for maximum power transfer between the primary coil 12 and the secondary coil 14, $$k_{pv} = \frac{1}{\sqrt[4]{Q_p Q_s}}. \quad (28)$$

The coupling coefficient, k, is therefore larger than that required for maximum power transfer, in some instances by an order of magnitude. The additional square root is consistent with maximizing voltage instead of power. Thus, the coil system 10 of the present disclosure is preferably constructed and designed to have a mutual inductance between the primary coil 12 and secondary coil 14 results in, or from, a coupling coefficient equal to or greater than the coupling coefficient defined in Eqn. (28).

The signal enhancement provided by the coil system 10 involves an impedance transformation from the secondary coil 14 to the primary coil 12 due to strong coupling and resonance of the secondary coil 14. This enhancement occurs whether or not the primary coil 12 is matched to a transmission line.

In general, the coil system 10 includes two stages. One couples the secondary coil 14 to the primary coil 12 to maximize signal, and the other provides critical coupling of the resonant coil system 10 to a transmission line. For a simple coil matched to a transmission line, critical coupling maximizes power transfer to or from the transmission line and the signal is presented only in this condition.

The eigenmode Q-value of the coupled coil system 10, obtained from the exact complex eigenfrequencies tends to be between $Q_p$ and $Q_s$ for the parallel mode. The Q-value is closest to the coil that has the highest current. This eigenmode Q-value generally corresponds to the (unloaded) Q-value as determined from the −3 dB points of the reflection coefficient, $(Z_{in}-Z_{in0})/(Z_{in}+Z_{in0})$, at the input to the primary coil 14.

Thermal noise voltage fluctuations appear at the primary output capacitor 16 and are proportional to the square-root of the real part of the input impedance. In many instances, the bandwidth of the receiver can be assumed to be smaller than the bandwidth of the circuits, and that the same receiver bandwidth is used for both coil systems. From Eqn. (14) it can be shown that, $$Re(Z_{in0}) = \omega_0 L_p Re(Q_{Pv})\frac{\omega_p^2}{\omega_0^2}\left(1 - \frac{1}{Q_p Q_s}\frac{\omega_0^2}{\omega_p \omega_s}\frac{1 + \frac{\omega_0^2}{\omega_p^2}}{1 - \frac{\omega_0^2}{\omega_s^2}}\right); \quad (29)$$

where $Re(K)=0$ was used.

The impedance transformation from the secondary coil 14 to the primary coil 12 reduces the resistance presented across the primary output capacitor 16. This reduced resistance is caused by the secondary resonance in the fourth-order system and is reflected by the factor $Re(Q_{Pv})$ in Eqn. (29) (see Eqn. (20)). This effect is not present in a second-order system; therefore, another reason that the coupled coil system 10 can give an enhanced signal-to-noise ratio ("SNR") is due to reduced noise at the primary output compared to a single coil.

As one non-limiting example, a coil system 10 in accordance with the present disclosure can be constructed using a self-resonant spiral ("SRS") coil for the secondary coil 14 and a single loop coil for the primary coil 12, as illustrated in FIG. 5. As one example of this configuration, the SRS coil can be fabricated from three turns of conductor to have an outer diameter of 15.1 mm and an inner diameter of 10.4 mm. The secondary coil 14 of this example can be cut from a CuFlon (Polyflon Company; Norwalk, Conn.) panel with 51 μm PTFE thickness and specified with 1/16 ounce of copper. The 1/16 ounce (per square foot) results in a thickness between 2.2-5.5 μm. The CuFlon can be cut into an 11.5 cm long by 1 cm wide strip, and this strip can be sandwiched between two 0.51 mm thick PTFE strips (with no cladding) of the same length and width, wound and placed inside a case. In this example, the case can be constructed from ABS plastic using 3D-printing techniques. The spacing between turns can be 1.07 mm.

In this example, the primary coil 12 was placed co-axially surrounding the SRS coil. The primary coil 12 can be constructed to have a nominal diameter of 25 mm, and a thickness and height of 2 mm. The primary coil 12 can be constructed using electric discharge machining ("EDM"); however, other construction techniques can also be used.

It will be appreciated by those skilled in the art that the primary and secondary coils can take other shapes or configurations than those described in the example above. The primary and secondary coils in the example described above were constructed using copper foil; however, those skilled in the art will understand that other suitable conductive materials can be used for constructing primary and secondary coils.

As described above, it is contemplated that the systems described here can be used in the construction of RF coils for high-field clinical MRI scanners. In addition to advancing MRI surface coil design and performance, it is contemplated that the systems described here can be used for improving coil designs for electron paramagnetic resonance ("EPR"), nuclear magnetic resonance ("NMR") spectroscopy, and non-imaging technologies such as antennas and low-noise amplifiers.

As another example, the coil systems described here can be implemented for constructing coil arrays for RF reception, transmission, or both. There are 32 coil arrays in clinical use, 64 coil arrays are available, and research is being done with 128 coil arrays. However, beyond that, with existing coil designs, there is little advantage to increasing the density of coils in the array above 64 because Q-factor declines. This decline in Q-factor with increased number of coils in the array has been a limiting factor in the development of improved coils. It is contemplated that the coil systems described here can enable the construction of coil arrays having a number of coils that is a multiple of 128 (e.g., 128, 256, 512). This would be particularly advantageous for the construction of high performance bird-cage coils for MRI of the brain that would allow rapid imaging of the brain without compromising resolution It is also contemplated that multiple parallel-mode coil ("PMC") designs can be implemented with the coil systems described here. For example, a PMC can be constructed to include at least two unconnected circular resonant loops, each loop having one or more capacitors in series in order to achieve resonance. These coil loops can be constructed to lie on a surface and have a common center, but differing diameters. The PMC construction can allow for tailoring of the currents in the coils. As opposed to current flowing through a thin wire, the current can be distributed over a larger area because the PMC construction effectively provides for a true "plane" of current. Advantageously, this construction can prevent hot spots from occurring.

The present invention has been described in terms of one or more preferred embodiments, and it should be appreciated that many equivalents, alternatives, variations, and modifications, aside from those expressly stated, are possible and within the scope of the invention.

The invention claimed is:

1. An inductively coupled coil system, comprising:
a primary coil independently tuned to a first resonance frequency;
a secondary coil independently tuned to a second resonance frequency;
wherein the secondary coil is inductively coupled to the primary coil with a mutual inductance that is larger than a mutual inductance associated with a maximum power transfer between the primary and secondary coils; and
wherein the primary and secondary coils are inductively coupled to form a single resonance system having a third resonance frequency that is a function of the first resonance frequency and the second resonance frequency, wherein the third resonance frequency is lower than the first resonance frequency and the second resonance frequency.

2. The inductively coupled coil system as recited in claim 1, wherein the primary coil has an outer extent and an inner extent, and the secondary coil has an outer extent that is smaller than the inner extent of the primary coil.

3. The inductively coupled coil system as recited in claim 2, wherein the secondary coil is arranged within the inner extent of the primary coil.

4. The inductively coupled coil system as recited in claim 3, wherein the primary coil is coplanar with the secondary coil.

5. The inductively coupled coil system as recited in claim 3, wherein the primary coil and the secondary coil are coaxially aligned.

6. A method for receiving at least one of magnetic resonance signals or electron paramagnetic resonance signals from an object using the inductively coupled coil system of claim 5, comprising operating the inductively coupled coil system in an anti-parallel mode such that currents in the primary coil and the secondary coil circulate in opposite directions.

7. The inductively coupled coil system as recited in claim 1, further comprising at least one capacitor in electrical communication with the primary coil, the at least one capacitor being tuned to define the first resonance frequency.

8. The inductively coupled coil system as recited in claim 1, further comprising at least one capacitor in electrical communication with the secondary coil, the at least one capacitor being tuned to define the second resonance frequency.

9. The inductively coupled coil system as recited in claim 1, wherein the primary coil is electrically connected to a transmission line.

10. The inductively coupled coil system as recited in claim 9, further comprising a capacitive network electrically connecting the primary coil to the transmission line.

11. The inductively coupled coil system as recited in claim 1, further comprising a signal detection circuit that detects a first current flowing in the primary coil that is induced in the primary coil by second current flowing in the secondary coil, wherein the second current is induced in the secondary coil by an external signal.

12. The inductively coupled coil system as recited in claim 11, wherein the external signal is a magnetic resonance signal.

13. The inductively coupled coil system as recited in claim 11, wherein the external signal has a frequency that is resonant with the third resonance frequency.

14. The inductively coupled coil system as recited in claim 11, wherein the first current has a first phase, the second current has a second phase, and a phase difference between the first phase and the second phase is less than 90 degrees.

15. The inductively coupled coil system as recited in claim 14, wherein the phase difference is zero.

16. The inductively coupled coil system as recited in claim 1, wherein the first resonance frequency is different from the second resonance frequency.

17. The inductively coupled coil system as recited in claim 1, wherein the mutual inductance between the primary and secondary coils is defined by a coupling coefficient having a value at or above, $$k_{pv} = \frac{1}{\sqrt[4]{Q_P Q_s}}$$

wherein $Q_P$ is a Q-value of the primary coil and $Q_s$ is a Q-value of the secondary coil.

18. The inductively coupled coil system as recited in claim 1, further comprising a detection circuit that is matched to the primary coil and receives a signal from the primary coil, wherein the signal represents at least one of a magnetic resonance signal or an electron paramagnetic resonance signal.

19. An inductively coupled coil system, comprising:
a primary coil independently tuned to a first resonance frequency;
a secondary coil independently tuned to a second resonance frequency;
a signal detection circuit that detects a first current flowing in the primary coil that is induced in the primary coil by second current flowing in the secondary coil, wherein the second current is induced in the secondary coil by an external signal, wherein the first current has a first phase, the second current has a second phase, and a phase difference between the first phase and the second phase is less than 90 degrees; and
wherein the secondary coil is inductively coupled to the primary coil with a mutual inductance that is larger than a mutual inductance associated with a maximum power transfer between the primary and secondary coils.

20. An inductively coupled coil system, comprising:
a primary coil independently tuned to a first resonance frequency;
a secondary coil independently tuned to a second resonance frequency;
wherein the secondary coil is inductively coupled to the primary coil with a mutual inductance that is larger than a mutual inductance associated with a maximum power transfer between the primary and secondary coils; and
wherein the mutual inductance between the primary and secondary coils is defined by a coupling coefficient having a value at or above, $$k_{pv} = \frac{1}{\sqrt[4]{Q_P Q_s}}$$

wherein $Q_P$ is a Q-value of the primary coil and $Q_s$ is a Q-value of the secondary coil.

* * * * *